(12) United States Patent
Bedell et al.

(10) Patent No.: US 9,041,167 B2
(45) Date of Patent: May 26, 2015

(54) RADIATION HARDENED SOI STRUCTURE AND METHOD OF MAKING SAME

(75) Inventors: Stephen W. Bedell, Wappingers Falls, NY (US); Bahman Hekmatshoartabari, White Plains, NY (US); Ali Khakifirooz, Mountain View, CA (US); Ghavam G. Shahidi, Round Ridge, NY (US); Davood Shahrjerdi, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 309 days.

(21) Appl. No.: 13/555,271

(22) Filed: Jul. 23, 2012

(65) Prior Publication Data
US 2013/0341770 A1    Dec. 26, 2013

Related U.S. Application Data

(63) Continuation of application No. 13/530,637, filed on Jun. 22, 2012, now Pat. No. 8,518,807.

(51) Int. Cl.
*H01L 21/00* (2006.01)
*H01L 21/3115* (2006.01)
*H01L 21/762* (2006.01)

(52) U.S. Cl.
CPC ....... *H01L 21/31155* (2013.01); *H01L 21/7624* (2013.01)

(58) Field of Classification Search
CPC ............ H01L 23/556; H01L 21/31155; H01L 21/7624
USPC .................................. 257/649, 632
See application file for complete search history.

(56) References Cited

U.S. PATENT DOCUMENTS 5,001,528 A    3/1991   Bahraman
5,360,752 A *  11/1994  Brady et al. ................ 438/459

(Continued)

FOREIGN PATENT DOCUMENTS

JP    2004-214629 A    7/2004

OTHER PUBLICATIONS

Yi, W. B., et al., "Formation of total-dose-radiation hardened materials by sequential oxygen and nitrogen implantation and multi-step annealing", Institute of Physics Publishing, Semiconductor Science and Technology, Semicond. Sci. Technol. (May 19, 2004) 571-573.

(Continued)

*Primary Examiner* — Laura Menz
(74) *Attorney, Agent, or Firm* — Scully, Scott, Murphy & Presser, P.C.; Louis J. Percello, Esq.

(57) ABSTRACT

An SOI substrate including a buried insulator layer positioned between a base substrate and a top semiconductor active layer is first provided. A semiconductor device can then be formed on and/or within a portion of the top semiconductor active layer. A bottommost surface of the buried insulator layer which is opposite a topmost surface of the buried insulator layer that forms an interface with the top semiconductor active layer can be then exposed. Ions can then be implanted through the bottommost surface of the buried insulator layer and into a portion of the buried insulator layer. The ions are implanted at energy ranges that do not disturb the buried insulator layer/top semiconductor active layer interface, while leaving a relatively thin portion of the buried insulator layer near the buried insulator layer/top semiconductor active layer interface intact.

19 Claims, 4 Drawing Sheets

(56) References Cited

U.S. PATENT DOCUMENTS

| | | |
|---|---|---|
| 5,795,813 A | 8/1998 | Hughes et al. |
| 5,807,771 A | 9/1998 | Vu et al. |
| 6,805,962 B2 | 10/2004 | Bedell et al. |
| 6,841,457 B2 | 1/2005 | Bedell et al. |
| 6,878,611 B2 | 4/2005 | Sadana et al. |
| 6,893,936 B1 | 5/2005 | Chen et al. |
| 6,946,373 B2 | 9/2005 | Agnello et al. |
| 6,991,998 B2 | 1/2006 | Bedell et al. |
| 7,022,585 B2 | 4/2006 | Solanki et al. |
| 7,049,660 B2 | 5/2006 | Bedell et al. |
| 7,067,400 B2 | 6/2006 | Bedell et al. |
| 7,074,686 B2 | 7/2006 | Bedell et al. |
| 7,125,458 B2 | 10/2006 | Bedell et al. |
| 7,169,226 B2 | 1/2007 | Bedell et al. |
| 7,172,930 B2 | 2/2007 | Adam et al. |
| 7,247,546 B2 | 7/2007 | Bedell et al. |
| 7,271,043 B2 | 9/2007 | Zhu et al. |
| 7,304,328 B2 | 12/2007 | Bedell et al. |
| 7,341,927 B2 | 3/2008 | Atwater, Jr. et al. |
| 7,348,253 B2 | 3/2008 | Bedell et al. |
| 7,442,993 B2 | 10/2008 | Bedell et al. |
| 7,473,587 B2 | 1/2009 | Bedell et al. |
| 7,473,969 B2 | 1/2009 | Aitken et al. |
| 7,485,539 B2 | 2/2009 | Adam et al. |
| 7,592,671 B2 | 9/2009 | Adam et al. |
| 7,679,141 B2 | 3/2010 | Bedell et al. |
| 7,833,884 B2 | 11/2010 | Bedell et al. |
| 7,897,444 B2 | 3/2011 | Adam et al. |
| 7,935,609 B2 | 5/2011 | Aitken et al. |
| 7,943,482 B2 | 5/2011 | Aitken et al. |
| 8,124,470 B1 | 2/2012 | Bedell et al. |
| 8,227,792 B2 | 7/2012 | Agnello et al. |
| 8,247,261 B2 | 8/2012 | Bedell et al. |
| 8,293,619 B2 | 10/2012 | Henley |
| 8,368,143 B2 | 2/2013 | Bedell et al. |
| 2003/0139000 A1 | 7/2003 | Bedell et al. |
| 2003/0197176 A1 | 10/2003 | Spallas et al. |
| 2004/0012075 A1 | 1/2004 | Bedell et al. |
| 2004/0094763 A1 | 5/2004 | Agnello et al. |
| 2004/0132267 A1 | 7/2004 | Sadana et al. |
| 2004/0192069 A1 | 9/2004 | Bedell et al. |
| 2004/0238885 A1 | 12/2004 | Bedell et al. |
| 2004/0242006 A1 | 12/2004 | Bedell et al. |
| 2004/0259334 A1 | 12/2004 | Bedell et al. |
| 2005/0082526 A1 | 4/2005 | Bedell et al. |
| 2005/0130424 A1 | 6/2005 | Bedell et al. |
| 2005/0208780 A1 | 9/2005 | Bedell et al. |
| 2006/0003555 A1 | 1/2006 | Adam et al. |
| 2006/0015776 A1 | 1/2006 | Lee |
| 2006/0027808 A1 | 2/2006 | Bedell et al. |
| 2006/0038228 A1 | 2/2006 | Aitken et al. |
| 2006/0081837 A1 | 4/2006 | Bedell et al. |
| 2007/0105350 A1 | 5/2007 | Bedell et al. |
| 2007/0111463 A1 | 5/2007 | Adam et al. |
| 2007/0164356 A1 | 7/2007 | Adam et al. |
| 2007/0281439 A1 | 12/2007 | Bedell et al. |
| 2008/0135875 A1 | 6/2008 | Agnello et al. |
| 2008/0246019 A1 | 10/2008 | Bedell et al. |
| 2008/0277690 A1 | 11/2008 | Adam et al. |
| 2008/0280416 A1 | 11/2008 | Bedell et al. |
| 2009/0117720 A1 | 5/2009 | Bedell et al. |
| 2009/0134460 A1 | 5/2009 | Adam et al. |
| 2009/0233079 A1 | 9/2009 | Bedell et al. |
| 2009/0280635 A1 | 11/2009 | Mathew et al. |
| 2010/0307572 A1 | 12/2010 | Bedell et al. |
| 2010/0311250 A1 | 12/2010 | Bedell et al. |
| 2012/0025311 A1 | 2/2012 | Canham |
| 2012/0217622 A1 | 8/2012 | Bedell et al. |
| 2012/0322244 A1 | 12/2012 | Bedell et al. |
| 2013/0005119 A1 | 1/2013 | Bedell et al. |
| 2013/0168823 A1* | 7/2013 | Iijima .................. 257/607 |

OTHER PUBLICATIONS

Office Action dated Apr. 25, 2013 received in the parent U.S. Patent Application, namely U.S. Appl. No. 13/530,637.

* cited by examiner

RADIATION HARDENED SOI STRUCTURE AND METHOD OF MAKING SAME

CROSS REFERENCE TO RELATED APPLICATION

This application is a continuation of U.S. patent application Ser. No. 13/530,637, filed Jun. 22, 2012 the entire content and disclosure of which is incorporated herein by reference.

BACKGROUND

The present disclosure relates to semiconductor-on-insulator (SOI) structures, and more particularly to a radiation hardened SOI structure and a method of fabricating the same.

Semiconductor-on-insulator (SOI) structures offer inherent improved radiation hardness over their bulk semiconductor counterparts. Despite the improved radiation hardness, SOI structures when used in a harsh total dose environment are still prone to radiation-induced failure due to charge build-up in the buried insulator layer. The charge build-up leads to degradation of device characteristics due to significant threshold voltage shift, increased leakage current and poor sub-threshold characteristics.

The prior art suggests implantation of acceptor-type dopants such as, for example, boron to mitigate the threshold voltage shift. Nevertheless, this prior art approach is not acceptable for thin-body silicon channel devices such as extremely thin semiconductor-on-insulator (ETSOI) and FinFET devices. Additionally, the prior art approach mentioned above does not provide full immunity for long-term use in harsh environments.

In order to further improve the radiation hardness of SOI structures, there have been proposed approaches to implant the buried insulator layer with ions such as nitrogen, aluminum, boron, arsenic, silicon and germanium. Nonetheless, implanting the buried insulator layer of the SOI structure will however complicate the device fabrication process, while the use of such schemes may wind up to be impractical for thin-body SOI structures. This will require implanting the buried insulator layer through the top semiconductor active layer, thereby generating substantial crystal defects within the top semiconductor active layer and damaging the interface between the buried insulator layer and the top semiconductor active layer. High temperature anneal steps are subsequently required to remove the crystalline damage due to implantation. Although high-temperature annealing will improve the crystalline quality of the top semiconductor active layer and its interface with the buried insulator layer, it may not fully recover the crystalline quality of the top semiconductor active layer thus degrade the transport properties in the top semiconductor active layer. Moreover, the requirements for using high dose can lead to amorphization of the top semiconductor active layer in thin-body SOI structures. Implanting the buried insulating layer through the top semiconductor active layer will additionally limit the choice of ions to those which are either inert in the semiconductor material of the top semiconductor active layer or dopant atoms in the top semiconductor active layer.

In view of the above, additional improvements in radiation hardness are desirable for long term usage of SOI structures in harsh environments such as, for example, outer space, nuclear reactors and particle accelerators. Additionally, improved radiation hardness is growing increasingly used as semiconductor processing becomes more radiative. For example, processing techniques such as reactive ion etching and plasma etching may introduce radiation damage into a semiconductor structure.

SUMMARY

An SOI substrate is provided which includes a buried insulator layer positioned between a base substrate and a top semiconductor active layer. A semiconductor device such as, for example, a CMOS circuit can then be formed on and/or within a portion of the top semiconductor active layer. A bottommost surface of the buried insulator layer which is opposite a topmost surface of the buried insulator layer that forms an interface with the top semiconductor active layer can, in some embodiments, be completely exposed. Ions can then be implanted through the bottommost surface of the buried insulator layer and into a portion of the buried insulator layer to make the buried insulator layer leaky and to prevent subsequent charge build-up. In accordance with the present disclosure, the ions are implanted at energy ranges that do not disturb the buried insulator layer/top semiconductor active layer interface, while leaving a relatively thin portion of the buried insulator layer near the buried insulator layer/top semiconductor active layer interface intact. The radiation hardened SOI structure that is provided can be transferred to a handle substrate.

In one aspect of the present disclosure, a method of forming a radiation hardened SOI structure is provided. The method includes providing a semiconductor-on-insulator substrate including a stack, from bottom to top, of a base substrate, a buried insulator layer, and a top semiconductor active layer, wherein an interface is present between a topmost surface of the buried insulator layer and a bottommost surface of the top semiconductor active layer. Next, at least one semiconductor device-containing region including at least one semiconductor device formed on and/or within a portion of the top semiconductor active layer is provided. At least a stressor layer is then provided on an exposed surface of the at least one semiconductor device-containing region, wherein the stressor layer has a fracture toughness that is greater than that of the base substrate. Next, a portion of base substrate is removed by spalling. Thereafter, ions are implanted into the buried insulator layer though the bottommost surface of the buried insulator layer that is opposite the topmost surface of the buried insulator layer that forms the interface with the top semiconductor active layer to provide a radiation hardened structure comprising the buried insulator layer that includes a doped region and a substantially non-doped region, wherein the substantially non-doped region has a surface in contact with the interface.

In another aspect of the present disclosure, a radiation hardened SOI structure is provided. The structure of the present disclosure includes at least one semiconductor device-containing region comprising at least one semiconductor device located on and/or within a portion of a top semiconductor active layer; and a buried insulator layer located beneath the at least one semiconductor device-containing region and the top semiconductor active layer, wherein a topmost surface of the buried insulator layer forms an interface with a bottommost surface of the top semiconductor active layer, and the buried insulator layer comprises a doped region and a substantially non-doped region that has an upper surface that extends to the bottommost surface of the top semiconductor active layer, and said doped region is located beneath the substantially non-doped region.

DETAILED DESCRIPTION

The present disclosure, which provides a radiation hardened SOI structure and a method of fabricating the same, will now be described in greater detail by referring to the following discussion and drawings that accompany the present application. It is noted that the drawings of the present application are provided for illustrative purposes and, as such, they are not drawn to scale. In the drawings and the description that follows, like elements are referred to by like reference numerals. For purposes of the description hereinafter, the terms "upper", "lower", "right", "left", "vertical", "horizontal", "top", "bottom", and derivatives thereof shall relate to the components, layers and/or elements as oriented in the drawing figures which accompany the present application.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

Figure 1:
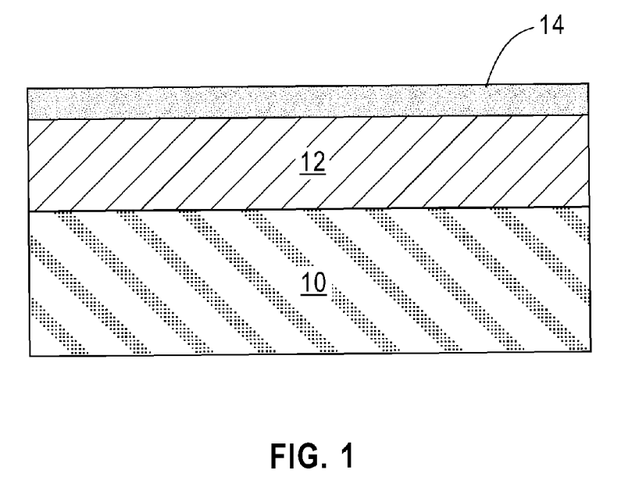
FIG. 1 is a pictorial representation (through a cross sectional view) illustrating an initial semiconductor-on-insulator (SOI) substrate including a stack, from bottom to top, of a base substrate, a buried insulator layer, and a top semiconductor active layer that can be used in one embodiment of the present disclosure.

Referring first to FIG. 1, there is illustrated an initial semiconductor-on-insulator (SOI) substrate that can be used in one embodiment of the present disclosure. The SOI substrate that can be employed in the present disclosure includes a stack, from bottom to top, of a base substrate 10, a buried insulator layer 12, and a top semiconductor active layer 14. As shown, a bottommost surface of the buried insulator layer 12 forms a first interface with a topmost surface of the base substrate 10, and the topmost surface of the buried insulator layer 12 forms a second interface with a bottommost surface of the top semiconductor active layer 14. The top semiconductor active layer 14 is the portion of the SOI substrate in which various semiconductor devices can be formed thereon and/or therein.

The base substrate 10 typically includes, but is not limited to, a semiconductor material. In some embodiments, the base substrate 10 can be a material other than a semiconductor material such as, for example, a glass, and/or a ceramic. When a glass is used as the base substrate 10, the glass can be an $SiO_2$-based glass which may be undoped or doped with an appropriate dopant. Examples of $SiO_2$-based glasses that can be employed as the base substrate 10 include undoped silicate glass, borosilicate glass, phosphosilicate glass, fluorosilicate glass, and borophosphosilicate glass. When the base substrate 10 comprises a ceramic, the ceramic can be any inorganic, non-metallic solid such as, for example, an oxide including, but not limited to, alumina, beryllia, ceria and zirconia, a non-oxide including, but not limited to, a carbide, a boride, a nitride and a silicide; or composites that include combinations of oxides and non-oxides.

The buried insulator layer 12 includes a dielectric material such as, for example, silicon dioxide, silicon nitride, boron nitride, a dielectric metal oxide (including metal oxides having a dielectric constant of greater than 3.9), or a combination thereof. The top semiconductor active layer 14 (herein after referred to just as SOI layer 14) includes a semiconductor material, which may be the same as, or different from, the semiconductor material of the base substrate 10.

When the base substrate 10 is comprised of a semiconductor material, each of the base substrate 10 and the SOI layer 14 includes a semiconductor material independently selected from elemental semiconductor materials (e.g., silicon, germanium, carbon, or alloys thereof), III-V semiconductor materials, or II-VI semiconductor materials. Each semiconductor material for the base substrate 10 and the SOI layer 14 can be independently single crystalline, polycrystalline, or amorphous. In one embodiment, the base substrate 10 and the SOI layer 14 are single crystalline semiconductor materials. In one embodiment, the base substrate 10 and the SOI layer 14 include single crystalline silicon.

In one embodiment, the base substrate 10 and/or SOI layer 14 can be doped with dopants of a first conductivity type. The first conductivity type can be p-type or n-type.

In one embodiment, the thickness of the SOI layer 14 can be from 2 nm to 2 μm, the thickness of the buried insulator layer 12 can be from 10 nm to 1,000 nm, and the thickness of the base substrate 10 can be from 50 microns to 2 mm, although lesser and greater thicknesses can also be employed for each of these layers. In one embodiment, and when an ETSOI device is to be formed, the SOI layer 14 can have a thickness from 2 nm to 50 nm.

Figure 2:
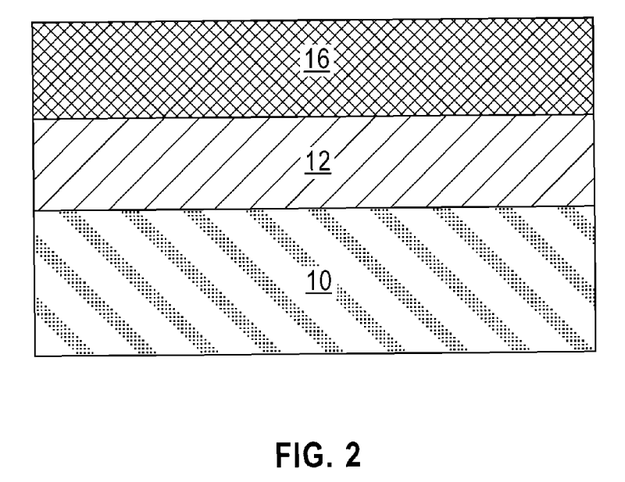
FIG. 2 is a pictorial representation (through a cross sectional view) illustrating the SOI substrate of FIG. 1 after forming at least one semiconductor device-containing region comprising at least one semiconductor device formed on and/or within the top semiconductor active layer of the SOI substrate.

Referring now to FIG. 2, there is illustrated the SOI substrate of FIG. 1 after forming at least one semiconductor device-containing region 16. The at least one semiconductor device-containing region 16 may include any number of active and/or passive semiconductor devices including, for example, transistors, capacitors, diodes, BiCMOS, resistors, memory devices, etc. processed on and/or within the uppermost surface of the SOI layer 14. At least a portion of SOI layer 14 remains (see, FIGS. 6-8, for example) within the at least one semiconductor device-containing region 16 and is present directly on a surface of the buried insulator layer 12 and thus there remains a buried insulator layer/SOI layer interface within the disclosed structure. Some portions of the SOI layer 14 can be used as components of the semiconductor device. For example, a portion of the SOI layer 14 can serve as a channel region of a field effect transistor and other portions of the SOI layer can serve as a source region and a drain region of the field effect transistor. As known to those skilled in the art, the source and drain regions are located adjacent the channel region and at a footprint of a patterned gate region.

The at least one semiconductor device is not shown in the present disclosure so as to not obscure the method of the present disclosure. Moreover, one skilled in the art would know the various components of the at least one semiconductor device and how such devices can be formed. Moreover, one skilled in the art would understand that the at least one semiconductor device is formed on and/or within at least a portion of the SOI layer 14. Various device regions can be partitioned by an isolation region as also known to those skilled in the art. Also, the SOI layer 14 is not shown in FIGS. 2-5 so as to not diminish the processing steps illustrated in those drawings.

The active and/or passive devices can be located beneath one or more interconnect structures as are well known to those skilled in the art. In one embodiment, the at least one semiconductor device-containing region 16 may include a complementary metal oxide semiconductor (CMOS) circuit including at least one first transistor of a first conductivity and at least one second transistor of a second conductivity, wherein the first conductivity and the second conductivity differ. In other embodiments, a plurality of semiconductor device-containing regions 16 can be formed vertically stacked one atop the other providing a three-dimensional stack of semiconductor circuits.

Figure 3:
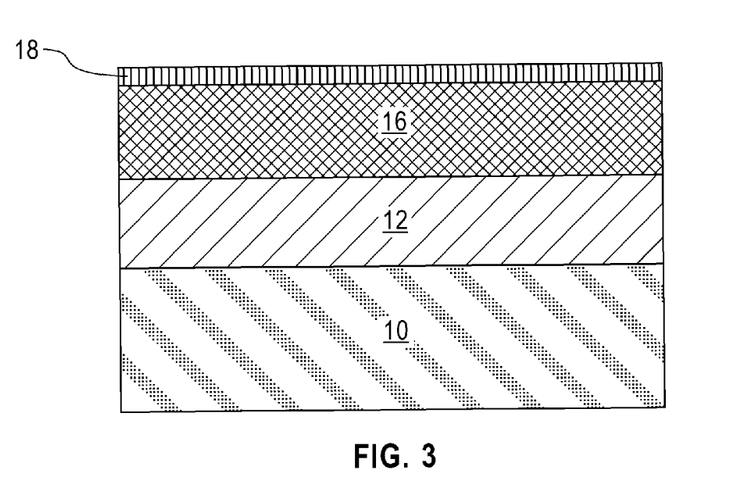
FIG. 3 is a pictorial representation (through a cross sectional view) illustrating the structure of FIG. 2 after forming a stressor layer on an exposed surface of the at least one semiconductor device-containing region.

Referring to FIG. 3, there is shown the structure of FIG. 2 after forming a stressor layer 18 on exposed surface of the least one semiconductor device-containing region 16. In some embodiments (not shown), an optional metal-containing adhesion layer can be formed on the least one semiconductor device-containing region 16 prior to forming stressor layer 18 so as to improve the adhesion of the stressor layer 18 to the at least one semiconductor device-containing region 16. Typically, the optional metal-containing adhesion layer is employed when a stressor layer 18 comprised of a metal is employed. In some embodiments, an optional plating seed layer (also not shown) can be formed directly atop the least one semiconductor device-containing region 16 prior to forming the stressor layer 18. In other embodiments, both optional layers, i.e., a metal-containing adhesion layer and a plating seed layer, can be used and formed prior to the stressor layer 18.

The optional metal-containing adhesion layer that may employed in the present disclosure includes any metal adhesion material such as, but not limited to, Ti/W, Ti, Cr, Ni or any combination thereof. The optional metal-containing adhesion layer may comprise a single layer or it may include a multi-layered structure comprising at least two layers of different metal adhesion/stressor materials.

The metal-containing adhesion layer can be formed at room temperature (15° C.-40° C., i.e., 288K to 313K) or above. In one embodiment, the optional metal-containing adhesion layer can be formed at a temperature which is from 20° C. (293K) to 180° C. (353K). In another embodiment, the optional metal-containing adhesion layer can be formed at a temperature which is from 20° C. (293K) to 60° C. (333K).

The metal-containing adhesion layer, which may be optionally employed, can be formed utilizing deposition techniques that are well known to those skilled in the art. For example, the optional metal-containing adhesion layer can be formed by sputtering, chemical vapor deposition, plasma enhanced chemical vapor deposition, chemical solution deposition, physical vapor deposition, and plating. When sputter deposition is employed, the sputter deposition process may further include an in-situ sputter clean process before the deposition.

When employed, the optional metal-containing adhesion layer typically has a thickness from 5 nm to 200 nm, with a thickness from 100 nm to 150 nm being more typical. Other thicknesses for the optional metal-containing adhesion layer that are below and/or above the aforementioned thickness ranges can also be employed in the present disclosure.

The optional plating seed layer is typically employed in embodiments in which the stressor layer to be subsequently formed is a metal and plating is used to form the metal-containing stressor material. The optional plating seed layer is employed to selectively promote subsequent plating of a pre-selected metal-containing stressor material. The optional plating seed layer may comprise, for example, a single layer of Ni or a layered structure of two or more metals such as Ti(bottom)/Ag(top).

The thickness of the optional plating seed layer may vary depending on the material or materials of the optional plating seed layer as well as the technique used in forming the same. Typically, the optional plating seed layer has a thickness from 2 nm to 400 nm. The optional plating seed layer can be formed by a conventional deposition process including, for example, chemical vapor deposition (CVD), plasma-enhanced chemical vapor deposition (PECVD), atomic layer deposition (ALD), and physical vapor deposition (PVD) techniques that may include evaporation and/or sputtering.

The optional metal-containing adhesion layer and/or the optional plating seed layer is (are) formed at a temperature which does not effectuate spontaneous spalling to occur within the base substrate 10. By "spontaneous" it is meant that the removal of a thin material layer from the base substrate 10 occurs without the need to employ any manual means to initiate crack formation and propagation for breaking apart a thin material layer from the base substrate 10. By "manual" it is meant that crack formation and propagation are explicit for breaking apart the thin material layer from the base substrate 10.

Stressor layer 18 that can be employed in the present disclosure includes any material that is under tensile stress at the spalling temperature. As such, the stressor layer 18 can also be referred to herein as a stress-inducing layer. In accordance with the present disclosure, the stressor layer 18 has a critical thickness and stress value that cause spalling mode fracture to occur within the base substrate 10. By "spalling mode fracture" it is meant that a crack is formed within base substrate 10 and the combination of loading forces maintain a crack trajectory at a depth below the uppermost surface of the base substrate 10. By "critical condition", it is meant that for a given stressor material and base substrate material combination, a thickness value and a stressor value for the stressor layer is chosen that render spalling mode fracture possible.

The thickness of the stressor layer 18 is chosen to provide a desired fracture depth(s) within the base substrate 10. The stress value for the stressor layer 18 is chosen to satisfy the critical condition for spalling mode fracture. The spalling process, conditions for spalling, and materials for spalling can include those mentioned within co-pending and commonly owned U.S. Patent Application Publication Nos. 2010/

0307572, and 2010/0311250, the entire contents of which are incorporated herein by reference.

Illustrative examples of materials that are under tensile stress when applied atop the base substrate 10 and thus can be used as the stressor layer 18 include, but are not limited to, a metal, a polymer, such as a spall inducing tape layer, or any combination thereof. The stressor layer 18 may comprise a single stressor material, or a multilayered stressor structure including at least two layers of different stressor material can be employed.

In one embodiment, the stressor layer 18 is a metal. In another embodiment, the stressor layer 18 is a spall inducing tape. In another embodiment, for example, the stressor layer 18 may comprise a two-part stressor layer including a lower part and an upper part. The upper part of the two-part stressor layer can be comprised of a spall inducing tape layer.

When a metal is employed as the stressor layer 18, the metal can include, for example, Ni, Cr, Fe, Ti and/or W. Alloys of these metals can also be employed. In one embodiment, the stressor layer 18 includes at least one layer consisting of Ni.

When a polymer is employed as the stressor layer 18, the polymer is a large macromolecule composed of repeating structural units. These subunits are typically connected by covalent chemical bonds. Illustrative examples of polymers that can be employed as the stressor layer 18 include, but are not limited to, polyimides polyesters, polyolefins, polyacrylates, polyurethane, polyvinyl acetate, and polyvinyl chloride.

When a spall inducing tape layer is employed as the stressor layer 18, the spall inducing tape layer includes any pressure sensitive tape that is flexible, soft, and stress free at a first temperature used to form the tape, yet strong, ductile and tensile at a second temperature used during spalling. By "pressure sensitive tape," it is meant an adhesive tape that will stick with application of pressure, without the need for solvent, heat, or water for activation. Tensile stress in the tape at the second temperature is primarily due to thermal expansion mismatch between the base substrate 10 (with a lower thermal coefficient of expansion) and the tape (with a higher thermal expansion coefficient).

In one embodiment and when the stressor layer 18 is a metal or polymer, the stressor layer 18 can be formed by a deposition process such as, for example, dip coating, spin-coating, brush coating, sputtering, chemical vapor deposition, plasma enhanced chemical vapor deposition, chemical solution deposition, physical vapor deposition, and/or plating. When the stressor layer 18 is a spall inducing tape layer, the spall inducing tape layer can be applied by hand or mechanical means.

If the stressor layer 18 is of a metallic nature, it typically has a thickness within a range from 3 µm to 50 µm, with a thickness within a range from 4 µm to 7 µm being more typical. Other thicknesses for a metallic stressor material that are below and/or above the aforementioned thickness ranges can also be employed in the present disclosure. If the stressor layer 18 is of a polymeric nature, it typically has a thickness in a range from 10 µm to 200 µm, with a thickness within a range from 50 µm to 100 µm being more typical. Other thicknesses for a polymeric stressor material that are below and/or above the aforementioned thickness ranges can also be employed in the present disclosure.

Figure 4:
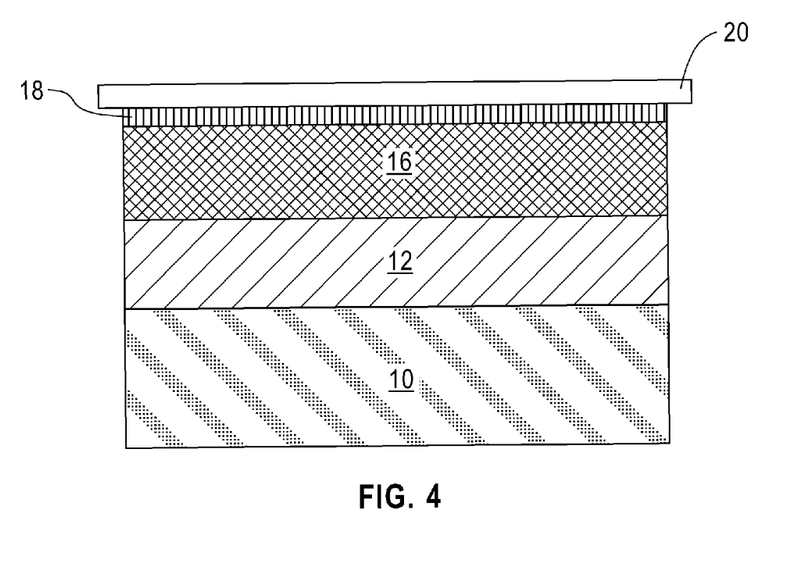
FIG. 4 is a pictorial representation (through a cross sectional view) illustrating the structure of FIG. 3 after application of a flexible handle substrate on an exposed surface of the stressor layer.

Referring now to FIG. 4, there is illustrated the structure of FIG. 3 after application of a flexible handle substrate 20 on an exposed surface of the stressor layer 18. In some embodiments, the application of a flexible handle substrate 20 can be omitted. The flexible handle substrate 20 employed in the present disclosure comprises any flexible material which has a minimum radius of curvature that is typically less than 30 cm. Illustrative examples of flexible materials that can be employed as the flexible handle substrate 20 include a metal foil or a polyimide foil. Alternatively, a tape as described above can be used as the flexible handle substrate 20. The flexible handle substrate 20 can be used to provide better fracture control and more versatility in handling the spalled portion of the base substrate 10. Moreover, the flexible handle substrate 20 can be used to guide the crack propagation during spalling. The flexible handle substrate 20 of the present disclosure is typically, but not necessarily, formed at a first temperature which is at room temperature (15° C.-40° C.).

The flexible handle substrate 20 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating. The flexible handle substrate 20 typical has a thickness of from 1 µm to few mm, with a thickness of from 70 µm to 120 µm being more typical. Other thicknesses for the flexible handle substrate 20 that are below and/or above the aforementioned thickness ranges can also be employed in the present disclosure.

Figure 5:
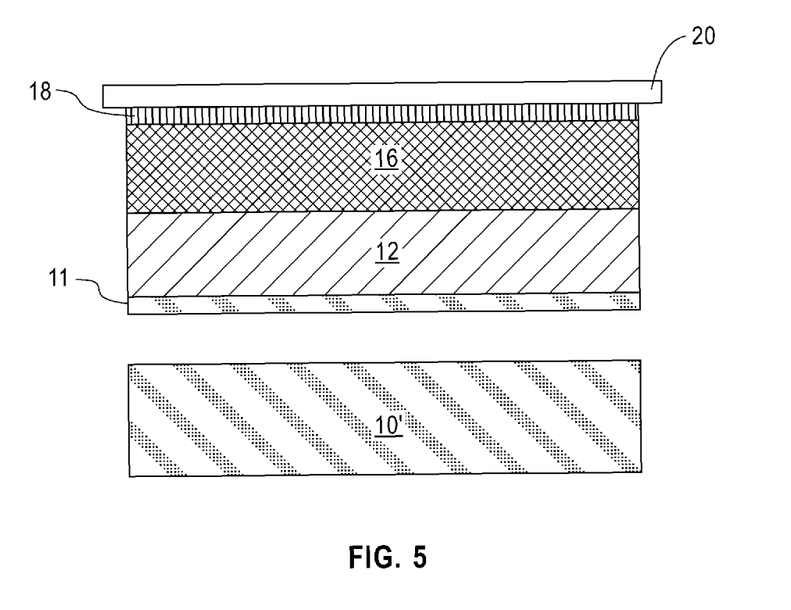
FIG. 5 is a pictorial representation (through a cross sectional view) illustrating the structure of FIG. 4 after performing a spalling process in which a portion of the base substrate of the SOI substrate is removed.

Referring now to FIG. 5, there is illustrated the structure of FIG. 4 after performing a spalling process in which a portion of the base substrate 10 located beneath the buried insulator layer 12 of the SOI substrate is removed. The portion of the base substrate 10 which is no longer attached to the buried insulator layer 12 can be referred to as herein as a non-spalled portion of base substrate, which is designated by reference numeral 10' in FIG. 5. The portion of the base substrate 10 that remains attached to the buried insulator layer 12 can be referred to herein as a spalled base material layer, which is designated by reference numeral 11 in FIG. 5. In one embodiment of the present disclosure, the spalled base material layer 11 that can remain attached to the buried insulator layer 12 can have a thickness of less than 100 microns. In another embodiment, the spalled base material layer 11 that can remain attached to the buried insulator layer can have a thickness of less than 50 microns.

Spalling can be initiated at room temperature or at a temperature that is less than room temperature. In one embodiment, spalling is performed at room temperature (i.e., 20° C. to 40° C.). In another embodiment, spalling is performed at a temperature less than 20° C. In a further embodiment, spalling occurs at a temperature of 77 K or less. In an even further embodiment, spalling occurs at a temperature of less than 206 K. In still yet another embodiment, spalling occurs at a temperature from 175 K to 130 K.

When a temperature that is less than room temperature is used, the less than room temperature spalling process can be achieved by cooling the structure down below room temperature utilizing any cooling means. For example, cooling can be achieved by placing the structure in a liquid nitrogen bath, a liquid helium bath, an ice bath, a dry ice bath, a supercritical fluid bath, or any cryogenic environment liquid or gas.

When spalling is performed at a temperature that is below room temperature, the spalled structure (i.e., the structure including spalled base material layer 11, the buried insulator layer 12, the at least one semiconductor device-containing region 16, the optional metal-containing adhesion layer, the optional plating seed layer, the stressor layer 18 and the flexible handle substrate 20) is returned to room temperature by allowing the spalled structure to slowly warm up to room temperature by allowing the same to stand at room temperature. Alternatively, the spalled structure can be heated up to room temperature utilizing any heating means.

Figure 6:
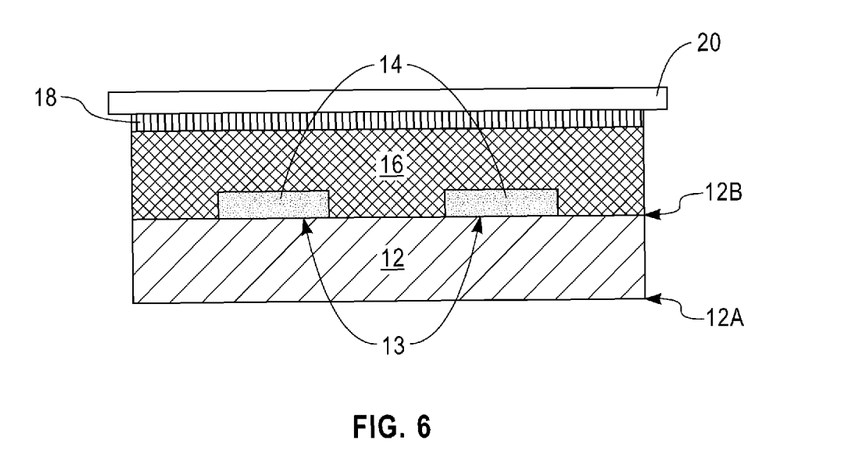
FIG. 6 is a pictorial representation (through a cross sectional view) illustrating the structure of FIG. 5 after removing a remaining portion of the base substrate exposing a first surface of the buried insulator layer of the SOI substrate which is opposite a second surface of the buried insulator layer that forms an interface with the top semiconductor active layer.

Referring now to FIG. 6, there is depicted the spalled structure of FIG. 5 after removing the spalled base material layer 11, exposing a first surface 12A (i.e., bottommost surface) of the buried insulator layer 12 of the SOI substrate which is opposite a second surface 12B (i.e., topmost surface) of the buried insulator layer 12 that forms an interface 13 with any remaining portion of SOI layer 14 that is present within the least one at least one semiconductor device-containing region 16. In some embodiments, the SOI layer 14 extends across the entirety of the buried insulator layer 12. In other embodiments, and as shown in FIG. 6, the SOI layer 14 can be partitioned into separate device regions. Interface 13 can extend the entire length of the structure, or it can be present only in selected device regions of the structure in which the SOI layer 14 remains.

In one embodiment, the removal of the spalled base material layer 11 can be performed utilizing a planarization process such as, for example, chemical mechanical polishing and/or grinding. In another embodiment, the removal of the spalled base material layer 11 can be performed utilizing an etching process such as, for example, a wet etch or a dry etch. In one embodiment, a wet etch comprising KOH, TMAH or NaOH as a chemical etchant can be used. In still another embodiment, the removal of the spalled base material layer 11 can be performed utilizing a combined oxidation and etching process. Notwithstanding which technique is used to remove the spalled base material layer 11 from the first surface 12A of the buried insulator layer 12, the technique used stops on the first surface 12A of the buried insulator layer 12.

In some embodiments, it may be possible to retain some or all of the spalled base material layer 11 on the first surface 12A of the buried insulator layer 12 as long as the thickness of the remaining spalled base material layer 11 does not serve as an implantation mask during the ion implantation to be subsequently performed. If the thickness of the spalled base material layer 11 is thick enough to deter the subsequent implantation of ions into the buried insulator layer 12, the spalled base material layer 11 can be thinned by etching or utilizing a combined oxidation and etching process. Generally, a thickness of from 500 nm or less of the spalled base material layer 11 can remain on the first surface 12A of the buried insulator layer 12 without interfering with the subsequent implantation of ions into the buried insulator layer 12.

Figure 7:
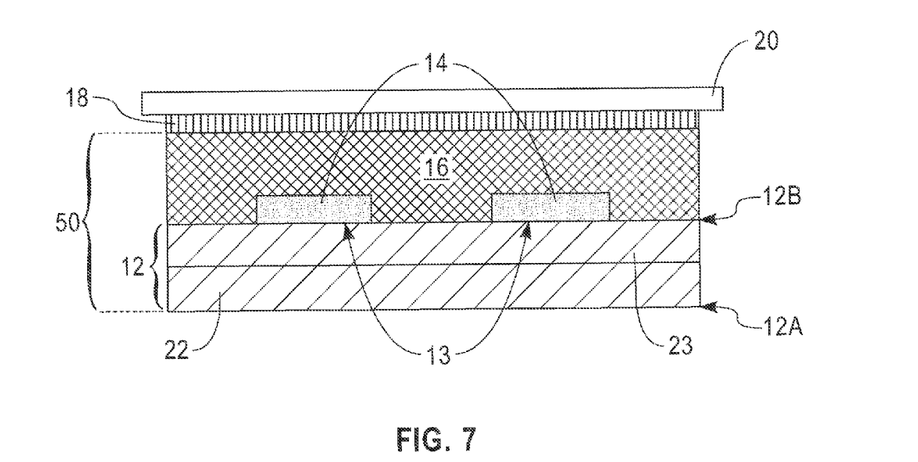
FIG. 7 is a pictorial representation (through a cross sectional view) illustrating the structure of FIG. 6 after the implantation of ions into the buried insulator layer through the first surface of the buried insulator layer providing a radiation hardened SOI structure.

Referring now to FIG. 7, there is illustrated the structure of FIG. 6 after the implantation of ions into the buried insulator layer 12 through the first surface 12A (i.e., bottommost surface) of the buried insulator layer 12 which provides a radiation hardened SOI structure 50. In the present disclosure, the implantation of ions into the buried insulator layer 12 does not affect the interface 13 between the SOI layer 14 and the buried insulator layer 12, nor do the ions pass through or reach the interface 13 between the buried insulator layer 12 and the SOI layer 14 that is present within the at least one semiconductor device-containing region 16. As such, no crystal defects are present within the SOI layer 14, and no damage to the interface 13 between the buried insulator layer 12 and the SOI layer 14 occurs.

The implantation of ions into the buried insulator layer 12 makes the buried insulator layer 12 leaky. By "leaky" it is meant that generated electron-hole pairs due to the radiation can freely move through the leaky oxide. Moreover, the implantation of ions into the buried insulator layer 12 prevents charge build-up within the structure and, as such, degradation of the device characteristics within the at least one semiconductor device-containing region 16 can be reduced.

Also, the implantation of ions into the buried insulator layer 12 provides a radiation hardened SOI structure 50.

As mentioned above, the implantation of ions into the buried insulator layer 12 occurs through the first surface 12A (i.e., bottommost surface) of the buried insulator layer 12 that is opposite the second surface 12B which forms interface 13 between the SOI layer 14 and the buried insulator layer 12. The implantation of ions through the bottommost surface, e.g., first surface 12A, forms a doped region 22 which includes implanted ions, and a substantially non-doped region 23 which contains substantially no implanted ions within the region. By "substantially non-doped region" it is meant a region of the buried insulator layer 12 in which the concentration of implanted ions therein is less than $10^{14}$ atoms/cm$^3$. In some embodiments, ions are completely absent from at least the uppermost portion of the substantially non-doped region 23 that contacts the topmost surface, i.e., second surface 12B, of the buried insulator layer 12 and thus the interface 13 is free of such ions.

The substantially non-doped region 23 has a surface which extends to the second surface 12B, i.e., topmost surface, of the buried insulator layer 12, while the doped region 22 has a surface which typically extends inward from the first surface 12A, i.e., bottommost surface, of the buried insulator layer 12. The doped region 22 is located beneath the substantially non-doped region 23 and no portion of the doped region 22 extends to the topmost surface, i.e., second surface 12B, of the buried insulator layer 12. As such, the doped region 22 does not come into contact with the SOI/buried insulator layer interface, i.e., interface 13.

In the present disclosure, the implantation of ions into the buried insulator layer 12 is performed in an ion implantation apparatus. The ion implantation apparatus that can be used in the present disclosure typically includes an ion source, where ions are produced, an accelerator, where the ions are electrostatically accelerated to a high energy, and a target chamber, where the ions impinge on the first surface 12A of the buried insulator layer 12.

In accordance with the present disclosure, the implanted ions are distributed to a depth within the doped region 22 according to a Gaussian distribution wherein the profile peak, i.e., projected range, increases with ion energy. In one embodiment, the profile peak of the doped region 22 can extend from the first surface 12A of the buried insulator layer 12 into the interior of the buried insulator layer 12 to a depth of about 40 nm for a 100 nm thick oxide. In another embodiment, the profile peak of the doped region 22 can extend from the first surface 12A of the buried insulator layer 12 into the interior of the buried insulator layer 12 to a depth of about 20 nm for an oxide thickness of 50 nm. In one embodiment, the substantially non-doped region 23 has a thickness extending from the topmost surface of the buried insulator layer 12 inward of greater than 5 nm.

The types of ions that can be implanted into the buried insulator layer 12 in the present disclosure are not limited as is the case in prior art processes in which ion implantation occurs through the interface between the buried insulator layer and the top semiconductor active layer. For example, the ions that can be implanted into the buried insulator layer 12 in the present disclosure may include, but are not limited to boron, silicon, germanium, aluminum, arsenic, and/or nitrogen.

In some embodiments of the present disclosure, a heavy ion can be implanted into the buried insulator layer 12. By "heavy ion" it is meant ions whose atomic mass is greater than the atoms that are present in the SOI layer 14. Examples of heavy ions that can be employed in the present disclosure include, but are not limited to, argon, germanium, and xenon. In some embodiments, the heavy ions can be used in conjunction with other ions that are mentioned above for ion implanting into the buried insulator layer 12. When heavy ions are employed, the dose of the heavy ions can be less than the dose of the other ions mentioned above for ion implanting into the buried insulator layer 12.

For non-heavy ions and in one embodiment of the present disclosure, the implant dose can be from $10^{13}$ atoms/cm$^2$ to $10^{16}$ atoms/cm$^2$. In another embodiment, and when non-heavy ions are employed, the implant dose can be from $10^{14}$ atoms/cm$^2$ to $10^{15}$ atoms/cm$^2$.

When heavy ions are employed in the present disclosure, and in one embodiment, the implant dose can be from $10^{11}$ atoms/cm$^2$ to $10^{16}$ atoms/cm$^2$. In another embodiment, and when heavy ions are employed in the present disclosure, the implant dose can be from $10^{12}$ atoms/cm$^2$ to $10^{14}$ atoms/cm$^2$.

In one embodiment, the implanting of ions into the buried insulator layer 12 can occur at a substrate temperature from 30K to 450K. In another embodiment, the implanting of ions into the buried insulator layer 12 can occur at a substrate temperature from 77K to 400K.

As mentioned above, the energy of the ion implant determines the depth of the doped region 22. The energy used should be sufficient to form a doped region 22 that is near the first surface 12A, i.e., bottommost surface, of the buried insulator layer 12, but not near the interface 13 between the SOI layer 14 and the buried insulator layer 12. In one embodiment of the present disclosure, the ion implant is performed at an energy from 1 KeV to 100 KeV. In another embodiment, of the present disclosure, the ion implant is performed at an energy from 1 KeV to 50 KeV.

In some embodiments of the present disclosure, the amount of ions that can be implanted into the buried insulator layer 12 can provide a concentration of ions within doped region 22 that does not adversely impact threshold voltage of the at least one semiconductor device within the at least one semiconductor device-containing region 16. In one embodiment of the present disclosure, the concentration of ions within doped region 22 that does not adversely affect threshold voltage of the at least one semiconductor device within the at least one semiconductor device-containing region 16 is from $10^{14}$ atoms/cm$^3$ to $10^{20}$ atoms/cm$^3$. In another embodiment of the present disclosure, the concentration of ions within doped region 22 that does not adversely affect threshold voltage of the at least one semiconductor device within the at least one semiconductor device-containing region 16 is from $10^{14}$ atoms/cm$^3$ to $10^{16}$ atoms/cm$^3$.

In some embodiments of the present disclosure, a post-implantation anneal may be performed. In other embodiments, the post-implantation anneal may be omitted. When a post-implantation anneal is performed, the post-implantation anneal may be performed at a temperature from 50° C. or greater. The upper limit of any post-implantation anneal may vary, but it is typically less than the back-end temperature limit. Generally, the post-implantation anneal can be performed either in vacuum or under an atmosphere that is non reactive to the radiation hardened SOI structure 50.

Figure 8:
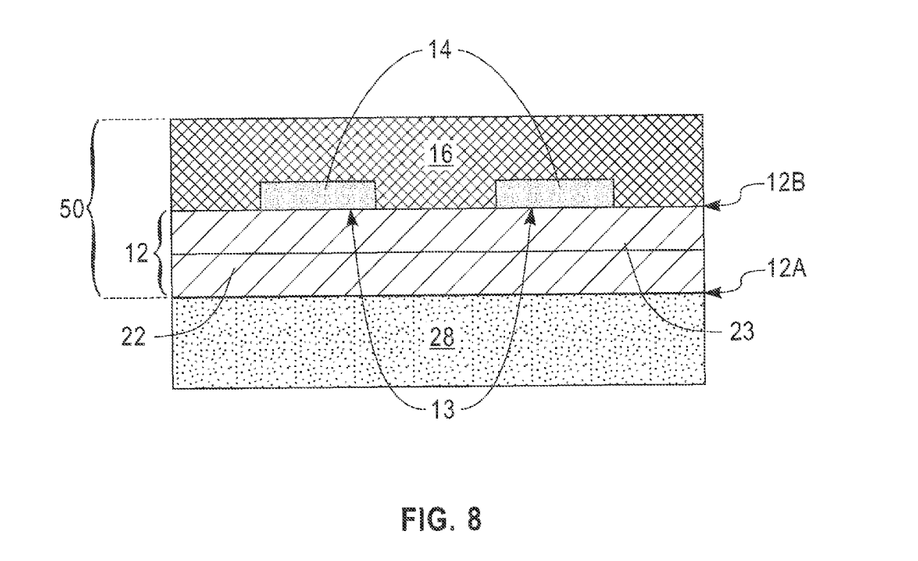
FIG. 8 is a pictorial representation (through a cross sectional view) illustrating the structure of FIG. 7 after transferring the radiation hardened SOI structure to another handle substrate and removing the stressor layer and the flexible handle substrate.

Referring to FIG. 8, there is depicted the structure of FIG. 7 after transferring the radiation hardened SOI structure 50 to another handle substrate 28 and removing the optional metal-containing adhesion layer, optional plating seed layer, the stressor layer 18 and the flexible handle substrate 20.

The radiation hardened SOI structure 50 can be transferred to substrate 28 utilizing a bonding process. The another handle substrate 28 may be rigid or flexible and may include, for example, a semiconductor material, glass, a ceramic, tape, plastic. Bonding can be achieved at room temperature, up to about 300° C. The bonding to the substrate 28 may occur in the presence of, or absence of, any remaining portion of spalled base material layer 11. An optional annealing may be performed after removing the stressor layer and the flexible handle layer to improve the bond strength.

After transferring the radiation hardened SOI structure 50 to substrate 28, the flexible handle substrate 20, stressor layer 18, and, if present the optional plating seed layer and the optional metal-containing adhesion layer can be removed utilizing conventional techniques well known to those skilled in the art. For example, and in one embodiment, aqua regia (HNO$_3$/HCl) can be used for removing the stressor layer 18. In another example, UV or heat treatment is used to remove the flexible handle substrate 20, followed by a chemical etch to remove the stressor layer 18, followed by a different chemical etch to remove the optional plating seed layer and optional metal-containing adhesion layer.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor structure comprising:
at least one semiconductor device-containing region comprising at least one semiconductor device located on and/or within a portion of a top semiconductor active layer that is free of crystal defects; and
a buried insulator layer located beneath said at least one semiconductor device-containing region and said top semiconductor active layer, wherein a topmost surface of said buried insulator layer forms a non-damaged interface with a bottommost surface of said top semiconductor active layer, and said buried insulator layer comprises, from top to bottom, a substantially non-doped region that has an upper surface that extends to said bottommost surface of said top semiconductor active layer, and a doped region spanning entirely across a bottommost surface of said substantially non-doped region.

2. The semiconductor structure of claim 1, further comprising a substrate located beneath said bottommost surface of said buried insulator layer.

3. The semiconductor structure of claim 1, wherein said doped region comprises ions selected from the group consisting of boron, silicon, germanium, aluminum, arsenic, nitrogen and mixtures thereof.

4. The semiconductor structure of claim 1, wherein said doped region comprises heavy ions selected from the group consisting of argon, germanium, and xenon.

5. The semiconductor structure of claim 1, wherein said top semiconductor active layer is an elemental semiconductor material, a III-V semiconductor material or a II-VI semiconductor material.

6. The semiconductor structure of claim 1, wherein said top semiconductor active layer comprises a single crystal Si-containing semiconductor material.

7. The semiconductor structure of claim 1, further comprising a base material layer on a bottommost surface of said buried insulator layer.

8. The semiconductor structure of claim 7, wherein said base material layer comprises a semiconductor material.

9. The semiconductor structure of claim 1, wherein said substantially non-doped region has a thickness extending from the topmost surface of the buried insulator layer inward of greater than 5 nm.

10. The semiconductor structure of claim 1, wherein said at least one semiconductor device comprises at least one transistor, and said at least one transistor has a channel region located within said portion of the top semiconductor active layer.

11. The semiconductor structure of claim 1, wherein said buried insulator layer comprises silicon dioxide or silicon nitride.

12. The semiconductor structure of claim 1, wherein said buried insulator layer comprises boron nitride.

13. The semiconductor structure of claim 1, wherein said buried insulator layer comprises a dielectric material oxide.

14. The semiconductor structure of claim 1, wherein the top semiconductor active layer has a thickness from 2 nm to 50 nm.

15. The semiconductor structure of claim 1, wherein said doped region has an ion concentration of from $10^{14}$ atoms/cm$^3$ to $10^{20}$ atoms/cm$^3$, and said ion concentration does not adversely affect a threshold voltage of the at least one semiconductor device within the at least one semiconductor device-containing region.

16. The semiconductor structure of claim 1, wherein no portion of said doped region extends to the topmost surface of the buried insulator layer and said interface.

17. The semiconductor structure of claim 1, wherein said substantially non-doped region has an ion concentration of $10^{14}$ atoms/cm$^3$ or less.

18. The semiconductor structure of claim 1, wherein a topmost portion of said substantially non-doped region located at said interface is free of dopant ions.

19. The semiconductor structure of claim 1, wherein said substantially non-doped region is free of dopants.

* * * * *